(12) United States Patent
Heim et al.

(10) Patent No.: US 6,617,994 B1
(45) Date of Patent: Sep. 9, 2003

(54) CAPACITIVE FLASH ANALOG TO DIGITAL CONVERTER

(75) Inventors: Pascal Heim, Bevaix (CH); Alessandro Mortara, Lausanne (CH); Peter Masa, Les Hauts Geneveys (CH); Friedrich Heitger, Bern (CH)

(73) Assignee: Bishop Innovation Limited, New South Whales (AU)

( * ) Notice: Subject to any disclaimer, the term of this patent is extended or adjusted under 35 U.S.C. 154(b) by 0 days.

(21) Appl. No.: 09/868,612

(22) PCT Filed: Dec. 1, 1999

(86) PCT No.: PCT/AU99/01063
§ 371 (c)(1),
(2), (4) Date: Oct. 11, 2001

(87) PCT Pub. No.: WO00/38326
PCT Pub. Date: Jun. 29, 2000

(30) Foreign Application Priority Data

Dec. 22, 1998 (AU) .............................................. PP 7828
Jun. 22, 1999 (AU) .............................................. PQ 1097

(51) Int. Cl.[7] .................................................. H03M 1/12
(52) U.S. Cl. ...................................... 341/172; 341/155
(58) Field of Search .............................. 341/172, 155, 341/120, 118, 159, 162, 156; 178/26.1

(56) References Cited

U.S. PATENT DOCUMENTS

| | | | |
|---|---|---|---|
| 4,129,863 A | * 12/1978 | Gray et al. | 341/172 |
| 4,395,732 A | * 7/1983 | Upton | 178/26.1 |
| 4,517,549 A | * 5/1985 | Tsukakoshi | 341/156 |
| 4,547,763 A | 10/1985 | Flamm | 341/118 |
| 4,742,330 A | * 5/1988 | Doernberg et al. | 341/159 |
| 4,764,753 A | * 8/1988 | Yukawa | 341/155 |
| 4,831,381 A | * 5/1989 | Hester | 341/162 |
| 4,922,252 A | 5/1990 | Draxelmayr et al. | 341/172 |
| 5,138,319 A | 8/1992 | Tesch | 341/156 |
| 5,214,430 A | 5/1993 | Gulczynski | 341/120 |
| 6,097,326 A | * 8/2000 | Opris et al. | 341/118 |
| 6,268,813 B1 | * 7/2001 | de Wit | 341/120 |

OTHER PUBLICATIONS

Patent Abstracts of Japan, JP 09/148932 A (Fuji Xerox Co Ltd) Jun. 6, 1997.
Patent Abstracts of Japan, JP 07/095030 A (Takayama, KK) Apr. 7, 1997.

* cited by examiner

*Primary Examiner*—Jean Bruner Jeanglaude
(74) *Attorney, Agent, or Firm*—Arent Fox Kintner Plotkin & Kahn

(57) ABSTRACT

An electronic circuit for a capacitive flash analog to digital converter for converting the ratio of first and second analog signals into a digital code representation using an array of parallel capacitive comparator branches. Each branch computing one bit of the digital code simultaneously according to its array index. The first analog signal is applied as a voltage difference between first signal nodes comprising a first positive signal node and a first negative signal node. The second analog signal is, applied as a voltage difference between second signal nodes comprising a second positive signal node and a second negative signal node.

11 Claims, 5 Drawing Sheets

CAPACITIVE FLASH ANALOG TO DIGITAL CONVERTER

TECHNICAL FIELD

This invention relates to Analog to Digital Converters (ADCs), particularly to electronic circuits for flash ADCs with accurate capacitive weighting, one clock cycle conversion, simple control, interchangeable inputs, and linear or nonlinear conversion.

BACKGROUND OF THE INVENTION

Capacitance is the most accurate device in many Very Large Scale Integration (VLSI) processes. This is one of the reasons, that many ADCs use capacitors and the charge redistribution principle. The most compact architectures in the prior art perform the conversion in many steps, rather than in parallel to save hardware (for example U.S. Pat. No. 4,831,381, U.S. Pat. No. 4,517,549, U.S. Pat. No. 4,129,863, and U.S. Pat. No. 4,922,252). These ADCs are hardware efficient, but can not be used at very high speeds because many clock cycles are needed for the conversion.

Flash converters perform conversion in parallel, mostly in one clock cycle. Most of the n-bit architectures in the prior art use a resistive ladder with $2^n$ resistors to generate a series of $2^n$ reference voltages and $2^n$ comparators in parallel to compare the input voltage to the plurality of the reference voltages. In these architectures the resistance of the switch which connects the resistive ladder to the reference voltage has to be taken into account. U.S. Pat. No. 4,742,330 discloses a capacitive flash ADC. This ADC performs $2^n$ bit conversion using $2^n$ parallel branches in three phases. In the first phase, offset cancellation takes place. In the second and the third phases the n-bit most significant bits (MSBs) and n-bit least significant bits (LSBs) are obtained respectively. The operation of the second phase is closely related to that of the classical flash ADC architecture with a resistive ladder which is described above. The MSBs determine the coarse range $\{V_i, \ldots, V_{i+1}\}$ where the input signal lies. In the third phase, the LSBs are determined by dividing the coarse voltage range $\{V_i \ldots V_{i+1}\}$ into $2^n$ fine voltage levels by using $2^n$ parallel branches, each containing $\log 2^n$ binary weighted capacitors. Some of these capacitors are connected to $V_i$ and others to $V_{i+1}$ to interpolate between the two extremities. The $2^n$ comparators compare the input voltage to the generated $2^n$ fine reference voltages in parallel.

A general feature of prior art ADC implementations is that the architectures are not symmetric with respect to the two input voltages, namely the reference voltage and the signal voltage that is being converted. In general, it is also assumed that the reference voltage is non-time-varying. In the following a principle is disclosed which overcomes these limitations It is aim of the invention to provide an electronic circuit for a capacitive flash ADC which ameliorates or overcomes one or more of the disadvantages of known capacitive flash ADC circuits:

It would be desirable if:
the architecture of the circuit is symmetric with respect to the two input voltages, so the reference voltage and the signal voltage which is being converted are interchangeable during operation,
the reference voltage can be time-varying and moreover can have as high a frequency components as the signal voltage which is being converted,
it will benefit from computing with the most accurate elements of VLSI processes capacitors,
it will perform analog to digital conversion within one clock cycle, and
the architecture is simple to control.

SUMMARY OF INVENTION

The present invention consists in an electronic circuit for a capacitive flash analog to digital converter for converting the ratio of first and second analog signals into a digital code representation using an array of parallel capacitive comparator branches, each branch computing one bit of the digital code simultaneously according to its array index, wherein the first analog signal is applied as a voltage difference between first signal nodes comprising a first positive signal node and a first negative signal node, the second analog signal is applied as a voltage difference between second signal nodes comprising a second positive signal node and a second negative signal node, each branch comprising:

(i) a comparator having a positive input node, a negative input node, a positive output node and a negative output node,
(ii) first and second positive capacitors having a positive common plate connected to the positive input node of the comparator,
(iii) first and second negative capacitors having a negative common plate connected to the negative input node of the comparator, and
(iv) first and second feedback switches; and wherein the first and second positive capacitors also respectively have first and second positive opposite plates which are respectively switchably connected to the first and second signal nodes, and the first and second negative capacitors also respectively have first and second negative opposite plates which are respectively switchably connected to the first and second signal nodes.

Preferably the analog to digital conversion is performed within one clock cycle comprising a first and second phase.

Preferably the digital code is a digital thermometer code.

Preferably, in the first phase of the clock cycle, the first positive opposite plate is connected to the first positive signal node and the second positive opposite plate is connected to the second negative signal node, the first negative opposite plate is connected to the first negative signal node and the second negative opposite plate is connected to the second positive signal node, and the first feedback switch connects the negative output node to the positive input node of the comparator and the second feedback switch connects the positive output node to the negative input node of the comparator; and in the second phase of the clock cycle, the first positive opposite plate is connected to the first negative signal node and the second positive opposite plate is connected to the second positive signal node, the first negative opposite plate is connected to the first positive signal node and the second negative opposite plate is connected to the second negative signal node, and both first and second feedback switches are open, thereby outputting one bit of the digital code by the polarity of the voltage difference between the positive and negative output nodes of the comparator Preferably the capacitances of the respective first positive, first negative, second positive and second negative capacitors are different for each branch according to the array index of that branch.

Preferably, in any one branch, the capacitance of the first positive capacitor substantially equals the capacitance of the first negative capacitor and the capacitance of the second positive capacitor substantially equals the capacitance of the second negative capacitor.

Preferably, in any one branch, the ratio of the capacitances of the first positive and second positive capacitors is a linear function of the array index of that branch, thereby providing a linear conversion between the ratio of the first and second analog signals and the digital code.

Alternatively it is preferred that, in any one branch, the ratio of the capacitances of the first positive and second positive capacitors is a nonlinear function of the array index of that branch, thereby providing a nonlinear conversion between the ratio of the first and second analog signals and the digital code.

Preferably the ratios of the capacitances of the respective capacitors in different branches are linearly spaced as a function of the array index.

Alternatively, it is preferred that the ratios of the capacitances of the respective capacitors in different branches are nonlinearly spaced as a function of the array index.

Preferably the first analog signal corresponds to the sine function of the phase angle of a periodic signal, the second analog signal corresponds to the cosine function of the phase angle of the periodic signal and, in any one branch, the ratio of the capacitances of first positive and second positive capacitors is a tangent function of a linear function of the array index of that branch, thereby providing a linear conversion between the phase angle and the digital code representation of this phase angle.

MODE OF CARRYING OUT INVENTION

Figure 1:
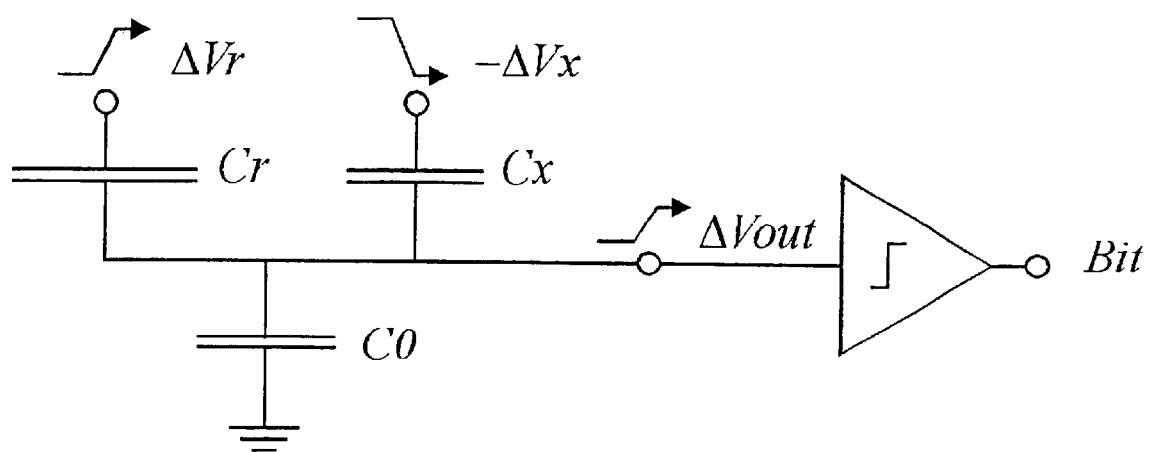
FIG. 1 shows an electronic circuit which demonstrates the basic principle of capacitive comparison of two analog signals.

FIG. 1 shows the principle which is the basis of the electronic circuit of the capacitive flash ADC according to the present invention. The analog input signals $\Delta V_x$, $\Delta V_r$ and output signal $\Delta V_{out}$ are voltage transitions, rather than the corresponding voltages $V_x$, $V_r$ and $V_{out}$. In a traditional discussion of an ADC, the input signal $V_x$ could be the signal voltage which is being compared to predefined proportions of the reference voltage $V_r$. However, in this embodiment of the present invention the circuit should be symmetric with respect to the two input signals, hence there is no fixed reference and in fact $V_r$ and $V_x$ can be interchanged.

In the following explanation, we refer to a plate of a capacitor as "common plate" if the plate is shared with the plate of another capacitor, and we use the term "opposite plate" to designate plates which are not shared. The basic idea of capacitive comparison is that the two input voltage transitions are applied to the opposite plates of the capacitors as shown in FIG. 1. The transitions have opposite sign, so one transition decreases the common plate voltage of the capacitors while the other transition increases it. The larger the capacitor, the larger the influence of the respective input.

Using the charge conservation principle, we can calculate the output voltage transition that is applied to the input of the comparator in FIG. 1 as:

$$\Delta V_{out} = \frac{\Delta V_r \cdot C_r - \Delta V_x \cdot C_x}{C_r + C_x + C_0} \quad [\text{eq .1}]$$

where $\Delta V_x$ and $\Delta V_r$ are the input voltage transitions, $C_x$ and $C_r$ are the respective capacitance values and $C_0$ is the parasitic capacitance between the common plate and the ground. It is assumed that, before the input voltage transitions are applied, $V_{out}=0$ so, after the input voltage transition, the comparator output will depend on the sign of the output voltage transition. The comparator output "Bit" will be 1 if $V_{out}$ increases, or it will be $-1$ if $V_{out}$ decreases. From eq. 1 we obtain the comparator output:

$$Bit = sign(\Delta V_{out}) = \begin{cases} 1 & \text{if } \frac{\Delta V_r}{\Delta V_x} > \frac{C_x}{C_r} \\ -1 & \text{if } \frac{\Delta V_r}{\Delta V_x} < \frac{C_x}{C_r} \end{cases} \quad [\text{eq .2}]$$

Consequently the capacitive comparator circuit compares the ratio of input voltage transitions to predefined ratio of capacitances $C_x/C_r$.

Figure 2:
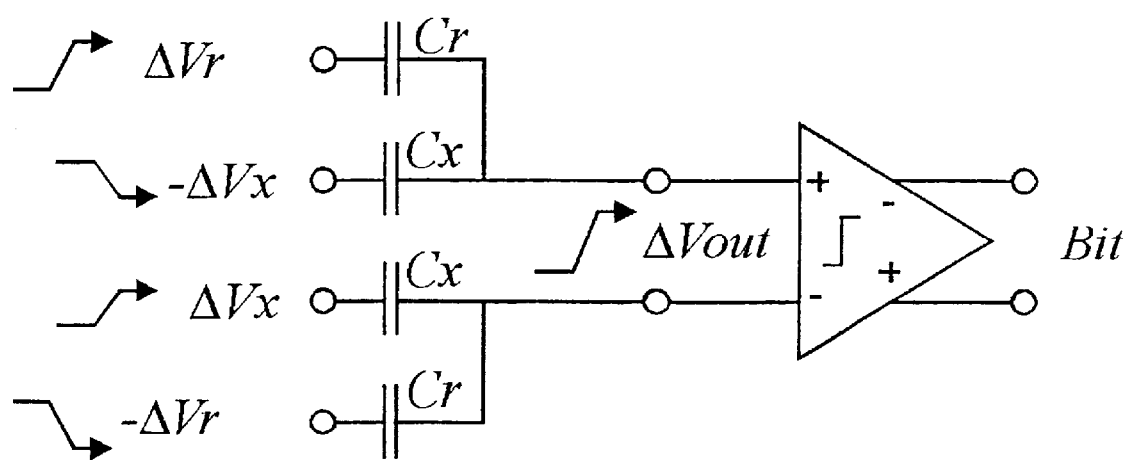
FIG. 2 shows the corresponding differential arrangement of the electronic circuit shown in FIG. 1.

FIG. 2 shows the corresponding differential arrangement of the electronic circuit shown in FIG. 1. Among the benefits of the differential arrangement is that both positive and negative voltage transitions can be simply generated by reversing the polarity of the differential signals.

Figure 3:
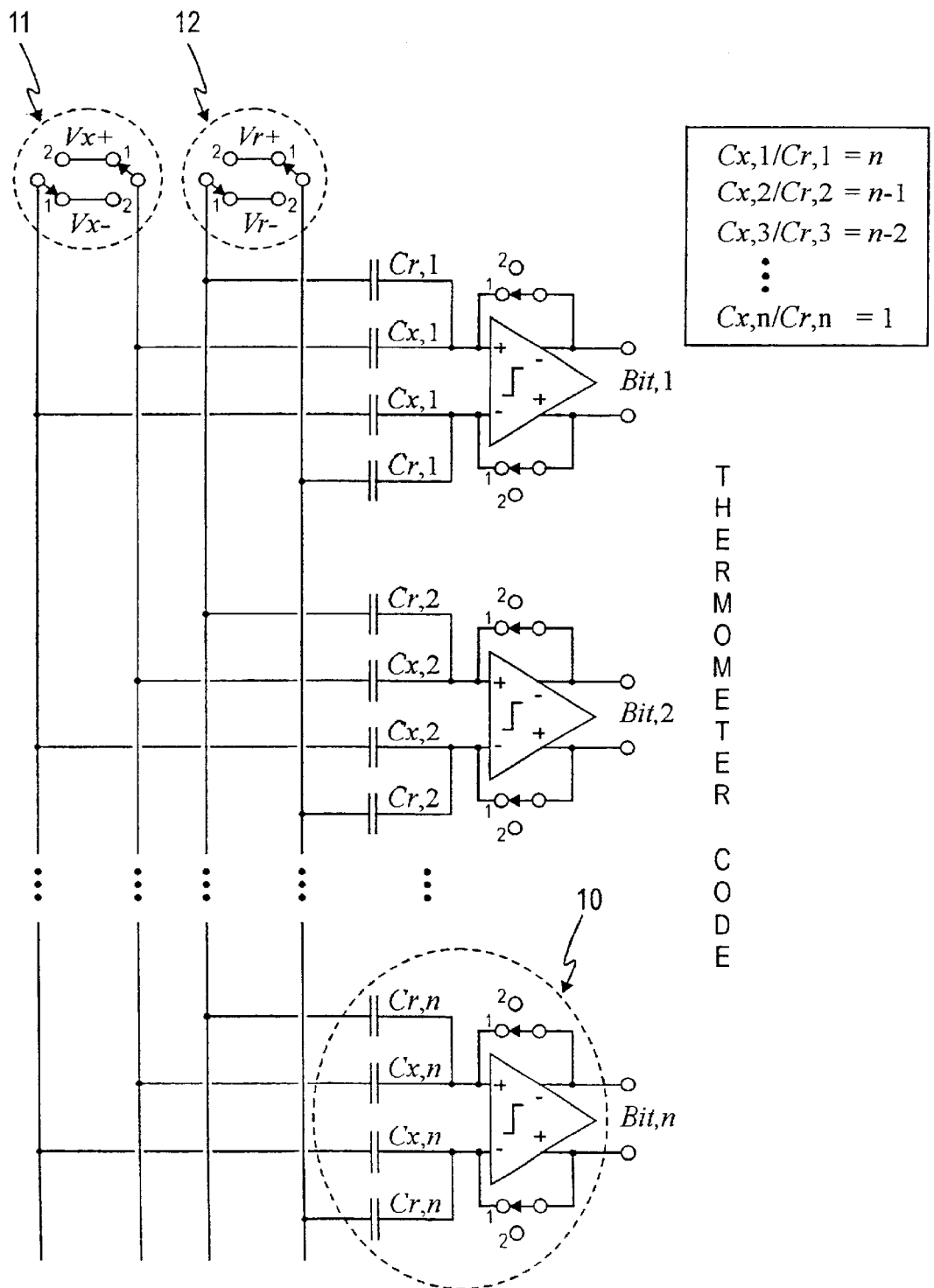
FIG. 3 shows an electronic circuit for a capacitive flash ADC according to the present invention.
Figure 4:
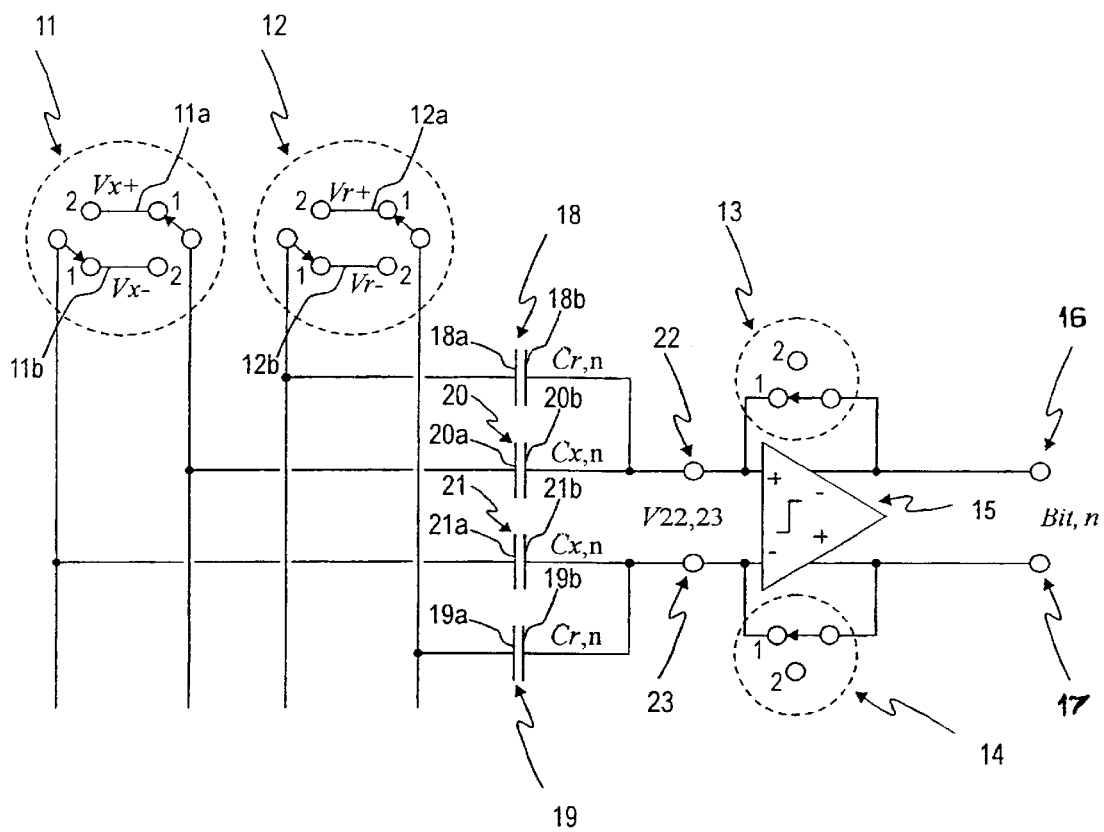
FIG. 4 shows a detailed view of one capacitive comparator branch from FIG. 3.
Figure 5:
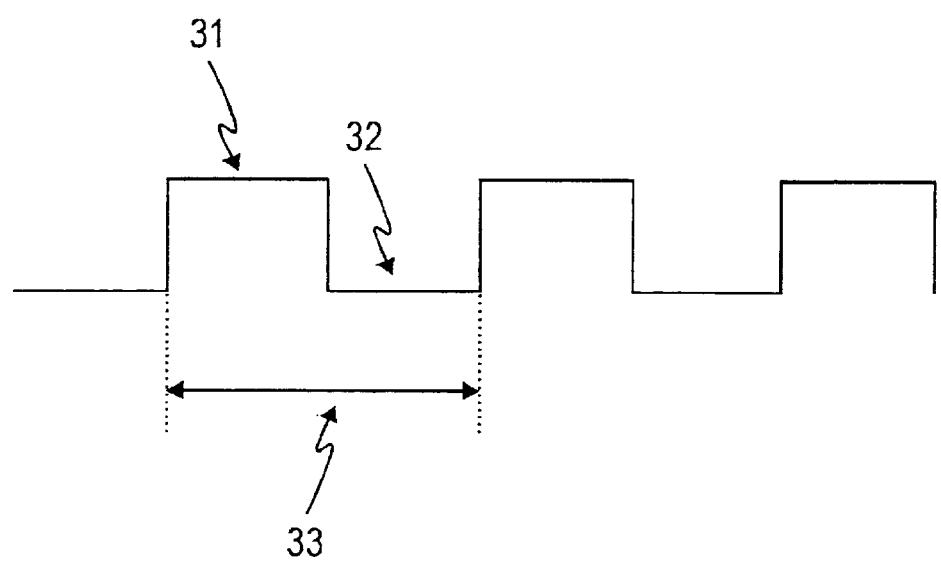
FIG. 5 shows the two phases of one clock cycle of the analog to digital conversion, performed by the electronic circuit according to the present invention.

FIG. 3 shows one embodiment of a capacitive flash ADC according to the present invention for converting the ratio of first and second analog signals into a digital code using an array of parallel branches of capacitive comparators. In this embodiment, the digital code demonstrated is a digital thermometer code. Hence, for example, an 8-bit representation of the decimal number "5" would be 00011111 and the 8-bit representation of the decimal number "6" would be 001 111111, etc. It should be recognized that digital codes other than thermometer codes would be also applicable according to the present invention. The analog to digital conversion is performed within one clock cycle 33 comprising a first phase 31 and a second phase 32 as shown in FIG. 5. In the first phase 31 offset cancellation takes place while during the second phase 32 the actual analog to digital conversion is performed. FIG. 4 shows a detailed view of one capacitive comparator branch 10 in FIG. 3.

In the first phase, as shown in FIGS. 3 and 4 with all the switches in position "1", switch sets 11 and 12 are in a first configuration so that the first analog signal $V_x$ has effectively positive polarity while the second analog signal $V_r$ has effectively negative polarity. Hence first positive opposite plate 20a of first positive capacitor 20 is connected to first positive signal node 11a of switch set 11, and second positive opposite plate 18a of second positive capacitor 18 is connected to second negative signal node 12b of switch set 12. First negative opposite plate 21a of first negative capacitor 21 is connected to first negative signal node 11b of switch set 11, and second negative opposite plate 19a of second negative capacitor 19 is connected to second positive signal node 12a of switch set 12. First feedback switch 13 connects negative output node 16 to positive input node 22 of comparator 15, and second feedback switch 14 connects positive output node 17 to negative input node 23 of comparator 15. The negative feedback through the closed feedback switches 13,14 forces the differential voltage between positive input node 22 and negative input node 23, and differential voltage between positive output node 17 and negative output node 16 of comparator 15, both to zero.

In the second phase, not shown but similar to FIGS. 3 and 4 except that all the switches are now in position "2", switch sets 11 and 12 are in a second configuration so that the first analog signal $V_x$ has effectively negative polarity while the second analog signal $V_r$ has effectively positive polarity. Hence first positive opposite plate 20a of first positive capacitor 20 is connected to first negative signal node 11b of switch set 11, and second positive opposite plate 18a of second positive capacitor 13 is connected to second positive signal node 12a of switch set 12. First negative opposite plate 21a of first negative capacitor 21 is connected to first positive signal node 11a of switch set 11, and second negative opposite plate 19a of second negative capacitor 19 is connected to second negative signal node 12b of switch set 12. Feedback switches 13, 14 are open, thereby outputting one bit of the thermometer code by the polarity of the voltage difference between positive output node 17 and negative output node 16 of comparator 15.

The capacitance ratios in the array of parallel capacitive comparator branches define the reference levels for the analog to digital conversion. This is now described in reference to capacitive comparator branch 10, shown in detail in FIG. 4. It should be noted that all the parallel branches have a similar electronic circuit, except for the actual capacitance values of capacitors 18, 19, 20, 21.

The total number of parallel branches n determines the resolution (ie. the number of bits) of the digital thermometer code, for example if 8 parallel branches of capacitive comparators are used (n=8), the output of the ADC will have a resolution of 8 bits. In this context it should be noted that an 8 bit resolution in the case of a thermometer code encodes only 8 different levels, rather than 256 levels as in the case of a non-redundant 8 bit binary code. The n parallel capacitive comparator branches (eg. branch 10) all receive the same voltage transitions corresponding to the first and second analog signals, and compare the ratio of these voltage transitions in parallel via n predefined capacitance ratios. The predefined ratios are the ratio of weighting capacitances 20 and 18 (or 21 and 19) ie. $C_x/C_r$.

The common plate 20b/18b of first and second positive capacitors 18 and 20 are connected to positive input node 22 of comparator 15, and the common plate 21b/19b of first and second negative capacitors 21 and 19 are connected to negative input node 23 of comparator 15. During the second phase of the clock cycle, the first positive opposite plate 20a of first positive capacitor 20 and the first negative opposite plate 21a of first negative capacitor 21 are connected respectively to first negative signal node 11b ($V_{x-}$) and first positive signal node 11a ($V_{x+}$). Similarly the second positive opposite plate 18a of second positive capacitor 18 and the second negative opposite plate 19a of second negative capacitor 19 are connected respectively to second positive signal node 12a ($V_{r+}$) and second negative signal node 12b ($V_{r-}$). The capacitances of the first positive and negative capacitors 20 and 21 are accurately matched (ie. designed to have equal capacitance) and the capacitances of the second positive and negative capacitors 18 and 19 are similarly matched. Hence, during this second phase of the clock cycle, the voltage transition at positive input node 22 and negative input node 23 of comparator 5 can each be obtained from eq.1 as respectively:

$$\Delta V_{22} = \frac{(V_{r+} - V_{r-}) \cdot C_r - (V_{x+} - V_{x-}) \cdot C_x}{C_r + C_x + C_0} = \frac{V_r \cdot C_r - V_x \cdot C_x}{C_r + C_x + C_0} \quad [eq.3]$$

$$\Delta V_{23} = \frac{(V_{r-} - V_{r+}) \cdot C_r - (V_{x-} - V_{x+}) \cdot C_x}{C_r + C_x + C_0} = \frac{-V_r \cdot C_r + V_x \cdot C_x}{C_r + C_x + C_0} \quad [eq.4]$$

where $V_{r+}$ and $V_{r-}$ are respectively the voltages at the second positive signal node 12a and second negative signal node 12b of switch set 12 due to the second analog (differential voltage) signal $V_r$ (ie. $V_r = V_{r+} - V_{r-}$), $V_{x+}$ and $V_{x-}$ are respectively the voltages at the first positive signal node 11a and the first negative signal node 11b of switch set 11 due to the first analog (differential voltage) signal $V_x$ (ie. $V_x = V_{x+} - V_{x-}$). $C_x$ is the weighting capacitance of $V_x$, $C_r$ is the weighting capacitance of $V_r$, and $C_0$ is the parasitic capacitance between the respective common plates and ground.

Therefore the differential voltage transition between positive input node 22 and negative input node 23 of comparator 15 is given by subtraction as:

$$\Delta V_{22,23} = 2 \frac{V_r \cdot C_r - V_x \cdot C_x}{C_r + C_x + C_0} \quad [eq.5]$$

In general, the n-th bit of the thermometer code, corresponding to the (binary) differential voltage transition between the positive output node 16 and the negative output node 17 of comparator 15 can be obtained similarly to eq.2:

$$Bit, n = sign(\Delta V_{22,23,n}) = \begin{cases} 1 & \text{if } \frac{V_r}{V_x} > \frac{C_{x,n}}{C_{r,n}} \\ -1 & \text{if } \frac{V_r}{V_x} < \frac{C_{x,n}}{C_{r,n}} \end{cases} \quad [eq.6]$$

The binary string (Bit,1; Bit,2; Bit,3 . . . Bit,n) therefore comprises a digital n-bit thermometer code representation of the ratio of the first and second analog (differential voltage) signals $V_r/V_x$.

To obtain a linear ADC that analog to digital converts the first analog signal $V_x$, the second analog signal $V_r$ is applied as a reference and the weighting capacitance ratios are arranged to be a linear function of the array index. Hence:

$C_{x,1}/C_{r,1} = n$ $C_{x,2}/C_{r,2} = n-1$ $C_{x,3}/C_{r,3} = n-2$

.

.

.

$C_{x,n}/C_{r,n} = 1$

Note, that in this embodiment, the weighting capacitances of the larger analog signal (ie. the reference voltage) are smaller than the weighting capacitances of the smaller analog signal (ie. the voltage signal on which analog to digital conversion is to be performed). Consequently, in this arrangement, the input signals are not interchangeable after fixing the capacitance ratios.

In other possible embodiments of the electronic circuit according to the present invention, the set of capacitance ratios is not restricted to a linearly spaced vector. Not even monotonicity is actually required.

One such possible embodiment is an electronic circuit of a particular nonlinear ADC. Assume that the phase angle a of a periodic signal is to be encoded, but phase angle a is not directly accessible. The only indirect information available about phase angle a is two analog signals, one is proportional to the sine function of the phase angle, and the other is proportional to the cosine function of the phase angle. Viz:

$$V_r = c \cdot \sin(\alpha) \quad [\text{eq.7}]$$

$$V_x = c \cdot \cos(\alpha) \quad [\text{eq.8}]$$

To obtain linear conversion from phase angle $\alpha$ to an n-bit thermometer code representation of $\alpha$, the weighting capacitance ratios are designed to be the tangent function of the phase angle ie. the tangent function of a linear function of the array index. Viz, for a phase angle a which varies in the range $0 < \alpha < \pi/4$:

$$C_{xi}/C_{ri} = \tan(\alpha_i) \alpha_i = i\pi/4n \text{ for } i=1\ldots n \quad [\text{eq.9}]$$

It will be appreciated, that the above descriptions are intended only to serve as examples, and that many other embodiments are possible within the spirit and the scope of the present invention.

What is claimed is:

1. An electronic circuit for a capacitive flash analog to digital converter for converting a ratio of first and second analog signals into a digital code representation using an array of parallel capacitive comparator branches, each branch computing one bit of the digital code simultaneously according to its array index, wherein the first analog signal is applied as a voltage difference between first signal nodes comprising a first positive signal node and a first negative signal node, the second analog signal is applied as a voltage difference between second signal nodes comprising a second positive signal node and a second negative signal node, each branch comprising:

(i) a comparator having a positive input node, a negative input node, a positive output node and a negative output node, (ii) first and second positive capacitors having a positive common plate connected to the positive input node of the comparator, (iii) first and second negative capacitors having a negative common plate connected to the negative input node of the comparator, and (vi) first and second feedback switches; and wherein the first and second positive capacitors also respectively have first and second positive opposite plates which are respectively switchably connected to the first and second signal nodes, and the first and second negative capacitors also respectively have first and second negative opposite plates which are respectively switchably connected to the first and second signal nodes.

2. An electronic circuit as claimed in claim 1, wherein the analog to digital conversion is performed within one clock cycle comprising a first and second phase.

3. An electronic circuit as claimed in claim 1, wherein the digital code is a digital thermometer code.

4. An electronic circuit as claimed in claim 2, wherein in the first phase of the clock cycle, the first positive opposite plate is connected to the first positive signal node and the second positive opposite plate is connected to the second negative signal node, the first negative opposite plate is connected to the first negative signal node and the second negative opposite plate is connected to the second positive signal node, and the first feedback switch connects the negative output node to the positive input node of the comparator and the second feedback switch connects the positive output node to the negative input node of the comparator; and in the second phase of the clock cycle, the first positive opposite plate is connected to the first negative signal node and the second positive opposite plate is connected to the second positive signal node, the first negative opposite plate is connected to the first positive signal node and the second negative opposite plate is connected to the second negative signal node, and both first and second feedback switches are open, thereby outputting one bit of the digital code by the polarity of the voltage difference between the positive and negative output nodes of the comparator.

5. An electronic circuit as claimed in claim 1, wherein the capacitances of the respective first positive, first negative, second positive and second negative capacitors are different for each branch according to the array index of that branch.

6. An electronic circuit as claimed in claim 1, wherein in any one branch, the capacitance of the first positive capacitor substantially equals the capacitance of the, first negative capacitor and the capacitance of the second positive capacitor substantially equals the capacitance of the second negative capacitor.

7. An electronic circuit as claimed in claim 6, wherein in any one branch, the ratio of the capacitances of the first positive and second positive capacitors is a linear function of the array index of that branch, thereby providing a linear conversion between the ratio of the first and second analog signals and the digital code.

8. An electronic circuit as claimed in claim 6, wherein in any one branch, the ratio of the capacitances of the first positive and second positive capacitors is a nonlinear function of the array index of that branch, thereby providing a nonlinear conversion between the ratio of the first and second analog signals and the digital code.

9. An electronic circuit as claimed in claim 1, wherein the ratios of the capacitances of the respective capacitors in different branches are linearly spaced as a function of the array index.

10. An electronic circuit as claimed in claim 1, wherein the ratios of the capacitances of the respective capacitors in different branches are nonlinearly spaced as a function of the array index.

11. An electronic circuit as claimed in claim 8, wherein the first analog signal corresponds to the sine function of the phase angle of a periodic signal, the second analog signal corresponds to the cosine function of the phase angle of the periodic signal and, in any one branch, the ratio of the capacitances of first positive and second positive capacitors is a tangent function of a linear function of the array index of that branch, thereby providing a linear conversion between the phase angle and the digital code representation of this phase angle.

* * * * *

UNITED STATES PATENT AND TRADEMARK OFFICE
CERTIFICATE OF CORRECTION

PATENT NO.    : 6,617,994 B1
DATED         : September 9, 2003
INVENTOR(S)   : Pascal Heim et al.

It is certified that error appears in the above-identified patent and that said Letters Patent is hereby corrected as shown below:

<u>Title page,</u>
Item [73], Assignee, please correct the address of the first Assignee to read as follows:
-- New South Wales (AU) --; and add the following Assignee's name and address:
-- CSEM Centre Suisse D'Electronique et de Micro Technique, S.A., Neuchatel, Switzerland --.

Signed and Sealed this

Second Day of December, 2003

JAMES E. ROGAN
*Director of the United States Patent and Trademark Office*